United States Patent [19]

Chen

[11] Patent Number: 5,341,042

[45] Date of Patent: Aug. 23, 1994

[54] LOW VOLTAGE, CASCODED NTL BASED BICMOS CIRCUIT

[75] Inventor: Chih-Liang Chen, Briarcliff Manor, N.Y.

[73] Assignee: International Business Machines Corporation, Armonk, N.Y.

[21] Appl. No.: 926,436

[22] Filed: Aug. 10, 1992

[51] Int. Cl.[5] .................... H03K 17/16; H03K 19/094
[52] U.S. Cl. .................... 307/446; 307/451; 307/456; 307/448
[58] Field of Search ............... 307/446, 456, 448, 451

[56] References Cited

U.S. PATENT DOCUMENTS

| | | | |
|---|---|---|---|
| 4,615,010 | 9/1986 | Davis et al. | 364/491 |
| 4,810,902 | 3/1989 | Storti et al. | 307/446 |
| 4,847,522 | 7/1989 | Fuller et al. | 307/473 |
| 4,859,878 | 8/1989 | Murayama | 307/446 |
| 4,868,421 | 9/1989 | Herndon et al. | 307/446 |
| 4,965,471 | 10/1990 | Gaboury | 307/446 |
| 4,999,519 | 3/1991 | Kitsukawa et al. | 307/446 |
| 5,003,199 | 3/1991 | Chuang et al. | 307/446 |
| 5,023,479 | 6/1991 | Jeffery et al. | 307/455 |
| 5,057,714 | 10/1991 | Hatano | 307/446 |
| 5,124,581 | 6/1992 | Umeki | 307/455 |
| 5,126,597 | 6/1992 | Usami et al. | 307/454 |
| 5,160,857 | 11/1992 | Barre | 307/446 |
| 5,162,673 | 11/1992 | Ohi | 307/446 |

FOREIGN PATENT DOCUMENTS 0307323  3/1989  European Pat. Off. .
4202266  7/1992  Fed. Rep. of Germany .
1261918 10/1989  Japan .

OTHER PUBLICATIONS

Vittoz, Eric A., "MOS Transistors Operated in the Lateral Bipolar Mode and Their Application in CMOS Technology", IEEE Journal of Solid-State Circuits, vol. SC-18, No. 3, Jun. 1983, pp. 273-279.

Schade, Otto H., Jr., "Session XVII: New Configurations for Analog Circuit Design", IEEE International Solid-State Circuits Conference, Feb. 17, 1978, Imperial Ballroom, pp. 230-231.

"Bias Technique for ECL in BiCMOS Technology", IBM Technical Disclosure Bulletin, vol. 34, No. 3, Aug. 1991, pp. 84-85.

Chen, Chih-Liang, "2.5-V Bipolar/CMOS Circuits for 0.25-μm BiCMOS Technology", IEEE Journal of Solid-State Circuits, vol. 27, No. 4, Apr. 1992, pp. 485-491.

Primary Examiner—Edward P. Westin
Assistant Examiner—Richard Roseen
Attorney, Agent, or Firm—David Aker

[57] ABSTRACT

A BiCMOS circuit including an NFET transistor connected as a diode is disclosed. The NFET transistor provides a threshold level for sourcing current. A PFET transistor and a clamping diode are connected in parallel to serve as a current path to the base of a bipolar emitter follower transistor. The emitter follower transistor and an NFET transistor act as pull-up and pull-down devices at the output stage. The NFET-diode turns off the current in the logic network as well as in the output buffer when the inputs are at a low logic level. As a result, the power consumed by this NTL based BiCMOS circuit is lower compared to that of an ECL based BiCMOS circuit. Also the drawbacks of a conventional NTL circuit, low noise immunity and signal degradation, are eliminated because the NFET-diode serves as a reference level for input signals. An additional embodiment wherein CMOS logic is cascoded with the existing bipolar logic to allow a higher logic function is also disclosed. The circuit of this invention can provide a single-phase output which is compatible with a low-voltage ECL/BiCMOS signal.

20 Claims, 3 Drawing Sheets

LOW VOLTAGE, CASCODED NTL BASED BICMOS CIRCUIT

BACKGROUND OF THE INVENTION

1. Field of the Invention

The present invention relates generally to BiCMOS integrated circuit devices and more particularly to a cascoded Non-Threshold Logic (NTL) based BiCMOS circuit arrangement with low power consumption and a multi-level logic function.

2. Description of the Prior Art

Due to the variety of applications in which semiconductor chips may be used, there are a number of logic families that are currently in use and available to circuit designers. Some of the families presently in use include transistor-transistor logic (TTL), diode-transistor logic (DTL), emitter-coupled logic (ECL) and metal oxide semiconductor logic (MOS).

Each logic family has specific advantageous properties as well as corresponding disadvantageous features. For example ECL logic is characterized in that it gives faster switching speeds than most other logic families. However, the standard ECL circuit dissipates a significant amount of power.

ECL circuits are able to function at high speed because the biases on the input transistors as well as the collector and emitter resistor ratios can be selected to avoid saturation. Since the delay associated with removing saturation-caused excess charge from the collector is avoided, the circuit has minimal switching delay. This low switching delay in combination with ECL's small voltage swings makes it one of the fastest technologies in use today. In addition to high speed, ECL provides a high fan out capability because of its emitter follower configuration.

On the other hand, the use of ECL is costly to designers in terms of power consumption. Since ECL functions by redirecting current instead of cutting it on and off, current through the emitter resistance is substantially constant regardless of the output state. This causes a very high power dissipation per gate in comparison with other technologies. As a result the number of gates which may be included on a chip is limited.

Designers using ECL have also been frustrated by the fact that ECL has been very difficult to interface with other logic families. This is especially true for ECL/MOS interfaces. Because of ECL's higher supply voltage requirements and elimination of transistor saturation, designers wishing to combine ECL with other technologies have been forced to include complex signal level conversion circuitry in the overall circuit.

Referring to FIG. 1, a prior art low-voltage ECL-based BiCMOS circuit 102 will be described. This circuit is also described in C. L. Chen, "2.5 V Bipolar/CMOS Circuits for 0.25 µm BiCMOS Technology", IEEE Journal of Solid State Circuits, Vol. 27, No. 4, April 1992, pp. 485–491 which is hereby incorporated by reference. This circuit operates at its minimum supply voltage of three times the emitter to base turn on voltage ($V_{be}$) or about 2.5 V. The ECL circuit is similar to a conventional ECL circuit in that it has resistor loads 122 and 124 and a current source controlled by a current mirror. The signal swing at the output 132 is one $V_{be}$ with a logical high being ($V_{dd} - V_{be}$) and a logical low being $V_{be}$ above ground.

This circuit is preferred over a conventional ECL circuit because it can operate using a 2.5 V CMOS supply and thus interface with CMOS circuitry relatively easily. In addition, since a minimum power supply is used, the relatively high power consumption of a standard ECL circuit is greatly reduced in the circuit represented in FIG. 1. Power consumption is also reduced in this circuit by terminating the pull-down NFET 126 in the emitter-follower to a diode 128.

The low-power ECL circuit 102, has a disadvantage in that it often has higher device counts than would be desirable. The inclusion of threshold elements in the circuit contributes to the high device count. Because a given function (in this case, the NOR function) takes more devices to perform, less logic can be fit into a given area and chip size must be increased to accommodate the same logic.

Another disadvantage of ECL which is inherent in the low-voltage ECL circuit of FIG. 1, is its limitation to a single level of logic. Cascoding of logic functions is not possible since each level requires the equivalent of one $V_{be}$ of supply voltage. In the low-voltage circuit of FIG. 1, the input transistor, load resistor and current source each use one $V_{be}$ thus allowing only one logic level.

Finally, the low-voltage ECL circuit of FIG. 1 still exhibits a relatively high power dissipation. Although the supply voltage has been reduced in the low-voltage circuit, the characteristic ECL constant current in the circuit still exists. As long as current is being redirected instead of cut off, the ECL circuit will be relatively power hungry.

FIG. 2 shows a prior art conventional non-threshold logic (NTL) circuit 202 which lowers the device count needed to perform a given function from that of ECL. While the ECL and NTL circuits in FIG. 1 and FIG. 2 are somewhat similar, a major difference is the fact that the reference transistor 110 coupled to the input transistors 112 and 114 in the ECL circuit 102 is not present in the NTL circuit 202. As a result, the voltage at the base 224 of the emitter follower transistor 220 immediately rises or falls when the input falls or rises, respectively. Thus, the delay in ECL attributable to the time it takes for the input signal to rise to $V_{ref}$ during pull-up, is not present in the NTL circuit of FIG. 2.

In an NTL circuit the input is not compared with a reference voltage as it is in ECL technology. In an ECL circuit, when the input level is above the reference level, a current flows through a load device and generates an output low level. On the other hand, when the input is below the reference level, the same current is redirected into a reference current branch. There is no voltage drop across the load device, and an output high level is generated.

By contrast, in an NTL circuit, there is no reference level or reference current branch. The high and low levels of an input signal vary the amount of current conducting in the load device. The difference in current results in a voltage difference across the load device and generates an output signal.

Because no reference voltage is required, NTL circuitry can be operated with a lower power supply than a conventional ECL circuit and it therefore dissipates less dc power than a conventional ECL circuit. In addition, because NTL does not require threshold logic, it has the advantage of smaller device counts as compared to conventional ECL technology. The current mirror which is used in ECL is not used in NTL and NTL, therefore, does not draw continuous current as does ECL.

The conventional NTL circuit is not without its drawbacks, however. There are two major problems encountered with NTL. First, due to the nature of the no-reference operation, even a small input variation induces a current change which can alter the output level. As a result, an NTL circuit is more sensitive to noise and input signal variation. Secondly, an NTL signal may degrade and diminish gradually if an input fails to reach its full signal level. For example, if an input signal swinging from a high level to a low level does not go low enough, the output high-level (assuming inverter or NOR logic) will be degraded from a desirable high level. This degraded signal will propagate through the circuit and will continuously worsen. In some situations, a signal may disappear completely.

SUMMARY OF THE INVENTION

Accordingly, it is an object of this invention to provide a BiCMOS circuit which does not generate degraded or diminished signals as a result of a less than full input signal level.

It is a further object of this invention to provide a cascoded circuit which allows a multiple level logic function.

It is another object of this invention to provide a BiCMOS circuit which is highly immune to noise and signal variation.

It is yet another object of this invention to provide a BiCMOS circuit with low power consumption.

It is a further object of this invention to provide a BiCMOS circuit which functions at a high speed.

It is a still further object of the present invention to provide a BiCMOS circuit which occupies a minimum amount of physical space on a VLSI chip.

It is yet another object of this invention to provide an NTL-based BiCMOS circuit which is signal level compatible with ECL-based BiCMOS circuits.

The BiCMOS circuit in accordance with the present invention includes an NFET transistor connected as a diode to provide a threshold level for sourcing current. A PFET transistor and a clamping diode are connected in parallel to serve as a current path to the base of a bipolar emitter follower transistor. The emitter follower transistor and an NFET transistor act as pull-up and pull-down devices at the output stage.

The NFET-diode turns off the current in the logic network as well as in the output buffer when the inputs are at a low logic level. As a result, the power consumed by this NTL based BiCMOS circuit is lower compared to that of an ECL based BiCMOS circuit. Also the drawbacks of a conventional NTL circuit, low noise immunity and signal degradation, are eliminated because the NFET-diode serves as a reference level for input signals. The circuit of this invention can provide a single-phase output which is compatible with a low-voltage ECL/BiCMOS signal.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 3A:
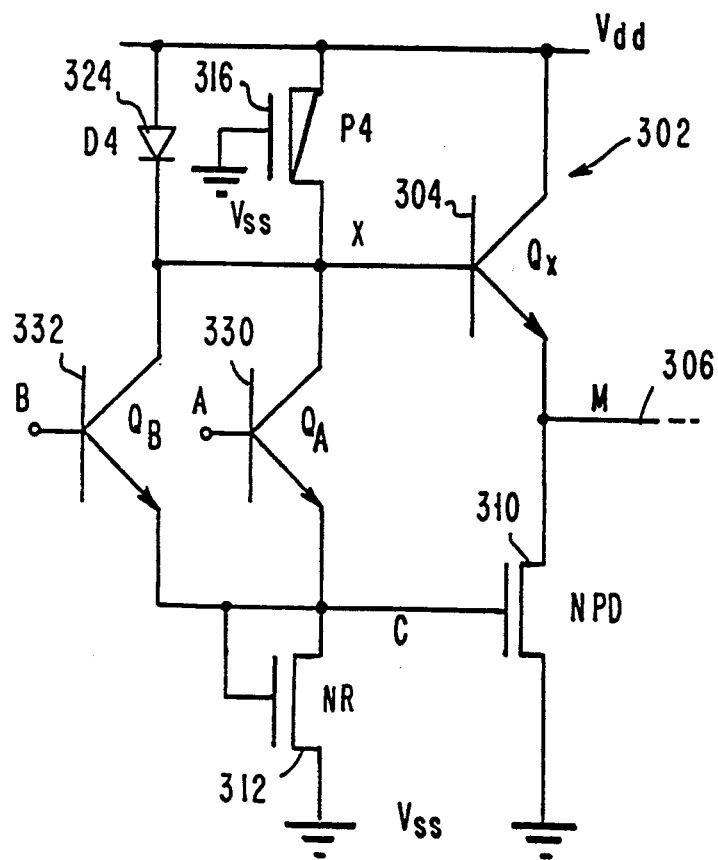
FIG. 3(a) is a schematic diagram of an NTL-based BiCMOS circuit which utilizes an NFET connected as a diode to switch the current sources in accordance with the present invention.

FIG. 3(a) is a schematic diagram of an NTL based BiCMOS circuit 302 which has minimal device count as in conventional NTL but with good noise immunity and without signal degradation.

The circuit 302 includes an NPN bipolar output transistor 304 having its collector tied to the power supply $V_{dd}$, its emitter tied to the output node 306 and its base tied to node X. Two more NPN bipolar transistors 330 and 332 are connected in parallel and function as input transistors with their bases being tied to input signals. The emitters of input transistors 330 and 332 are coupled and connected to the gate of pull-down transistor 310 (at node C). Pull-down transistor 310 is an NFET transistor having its source electrode connected to the emitter of an NPN bipolar output transistor 304, i.e., to the output node 306, and its drain electrode connected to ground ($V_{ss}$). As would be apparent to one skilled in the art, the source and drain of pull-down transistor 310 are interchangeable as they would be in any MOS transistor.

In addition, the circuit of this invention contains an NFET transistor connected as a diode. NFET diode 312 has its drain and gate electrodes tied to the emitters of input transistors 330 and 332 (at node C) and its source electrode connect to ground ($V_{ss}$). NFET diode 312 serves a number of functions which will be discussed below.

A clamping diode 324 is placed between the power supply $V_{dd}$ and the base of NPN output bipolar transistor 304. Finally the circuit contains a P-channel MOS field effect transistor (PFET) 316 which functions as a load resistor since its gate is tied to ground ($V_{ss}$). The sizes of the NFET diode 312 and the PFET device 316 are chosen so that the potential level at node C swings from $V_{tn}$ to a high level close to $V_{be}$.

Figure 1:
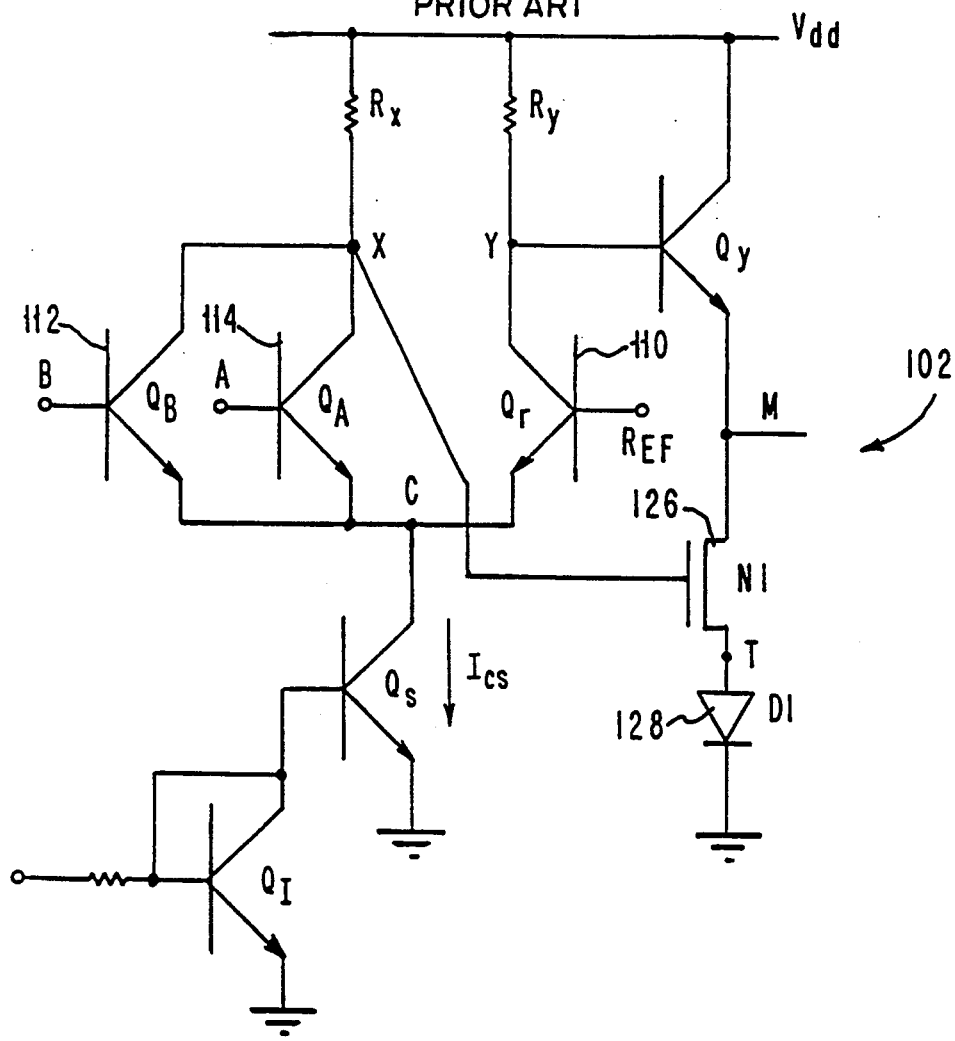
FIG. 1 is a schematic diagram of a prior art ECL-based BiCMOS circuit.
Figure 2:
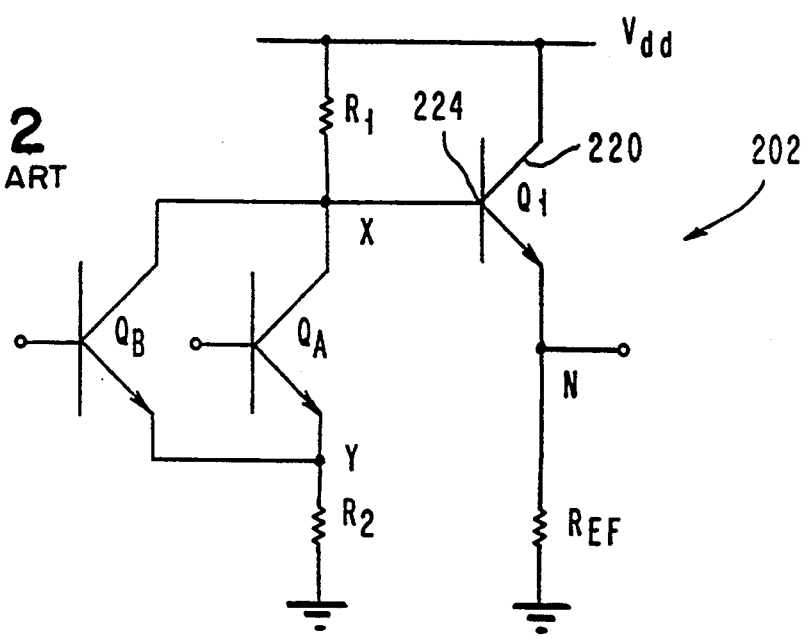
FIG. 2 is a schematic diagram of a prior art NTL circuit.

It can be seen that in the new circuit shown in FIG. 3(a), the PFET device 316 and a clamping diode 324 have replaced load device R1 in FIG. 2. The PFET device 316 is biased as a linear resistor having its gate tied to $V_{ss}$. The PFET device may be replaced by a simple resistor if available in the process technology. A clamping diode 324 is used to clamp node X to a potential of ($V_{dd}-V_{be}$) when the output is at a low level. The clamping diode 324 may be implemented either as a junction diode or an NPN transistor connected as a diode. The bias resistor R2 in FIG. 2 is replaced by the NFET diode 312. The pull-down resistor $R_{EF}$ is replaced by a pull-down NFET 310. Pull-down NFET 310 is gated at node C so that a current path from the output 306 to ground will only exist when node C approaches $V_{be}$ which is higher than $V_{tn}$.

The circuit is operated with a power supply of 3 * $V_{be}$ or about 2.5 V. The input and output signals have a swing of one $V_{be}$. The output has a high level of $(V_{dd}-V_{be})$ due to the emitter-follower and a low level of $(V_{dd}-2V_{be})$ due to a signal swing of one $V_{be}$ across the load devices. The signal level at node C (across the NFET diode 312) is set by the input signal, either at a level below the NFET threshold voltage (typically about 0.5 V) or one $V_{be}$ above ground.

Figure 3B:
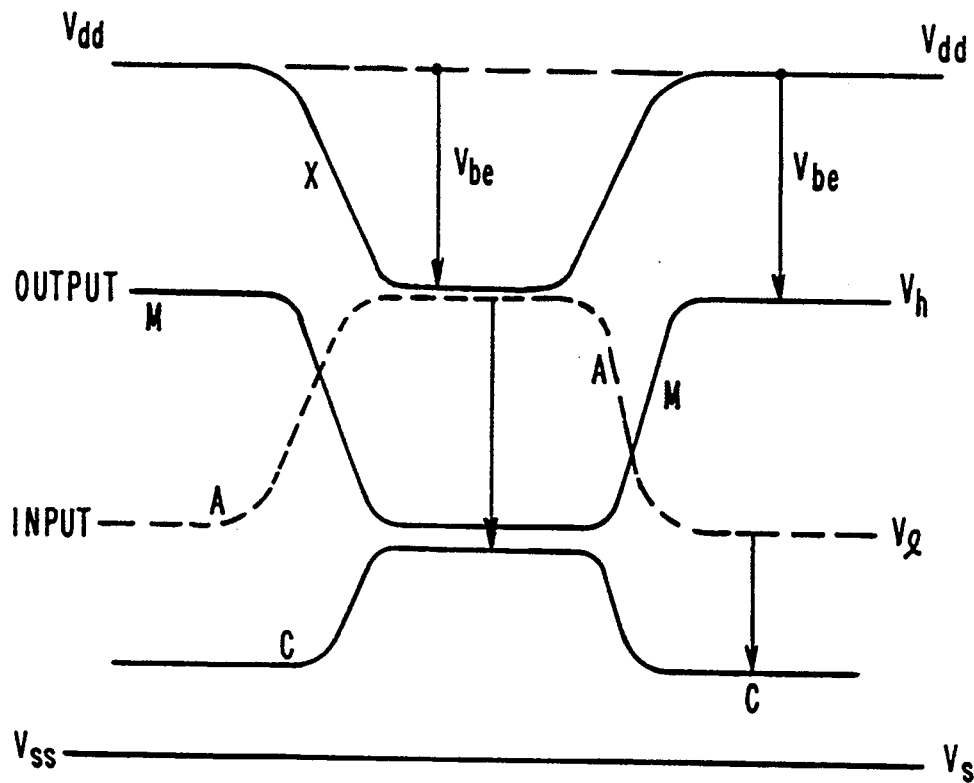
FIG. 3(b) is a waveform diagram illustrating the signal levels at various points in the circuit of this invention during operation.

The operation of the circuit in the present invention is explained as follows and in conjunction with FIG. 3(b). When an input switches from a low level of 0.8 V to a high level of 1.6 V, the voltage at node C follows the input from approximately one NFET threshold voltage $(V_{tn})$ to a high level of 0.8 V. The pull-down NFET 310 is then turned on by the high level of 0.8 V at node C. The voltage at node X drops by one $V_{be}$ from approximately $V_{dd}$ to $V_{dd}-V_{be}$. The output follows node X to $V_{dd}-2V_{be}$ and is thus driven to a low level of 0.8 V.

When an input at either node A or node B switches from a high level of 1.6 V to a low level of 0.8 V (and assuming a low level on the other input node), the voltage at node C follows the input to $V_{tn}$ above ground and remains at this level for the rest of the switching operation. During the latter part of the switching from an input level of $(V_{tn}+V_{be})$ to $V_{be}$, the NFET diode 312 is turned off. As a result, the current in the logic network is cut off except for a small amount of sub-threshold leakage current through the NFET diode 312. When the input reaches a low level of 0.8 V, the voltage at the emitter can be as low as zero volts. Thus, node C can be discharged to a level somewhere between zero and $V_{tn}$ by a leakage current through the NFET diode 312. The $V_{tn}$ potential at node C turns off the pull-down NFET 310. The voltage at node X during this time rises from $(V_{dd}-V_{be})$ to close to $V_{dd}$. This turns on bipolar output transistor 304 and the voltage at output 306 is pulled up to an output high of 1.6 V. This output high is obtained while the circuit consumes no dc current either in the output buffer or in the logic network.

Because the current path through the bias resistor R2 to ground in FIG. 2 (the conventional NTL circuit) does not exist in the circuit of this invention, signal degradation of a conventional NTL circuit is not present in this new NTL based BiCMOS circuit. The threshold level of the NFET diode 312 effectively cuts off the current in the logic network when the input is low. A degraded low level does not affect the output high level $(V_{dd}-V_{be})$ as long as the input low level is below $(V_{be}+V_{tn})$ or about 1.3 V. Typically, an input signal is designed to stay at a low level much lower than 1.3 V for a low voltage supply.

A degraded high level at the input terminal does result in a degraded low level at the output in the circuit of the present invention. This is because a degraded high level at the input reduces the current in the NFET diode 312. But this does not present a problem, however, since the degraded low level can not propagate due to the threshold of the NFET diode 312. Thus, a degraded high level does not cause further degradation at the output after propagating through an inverting stage.

Figure 4:
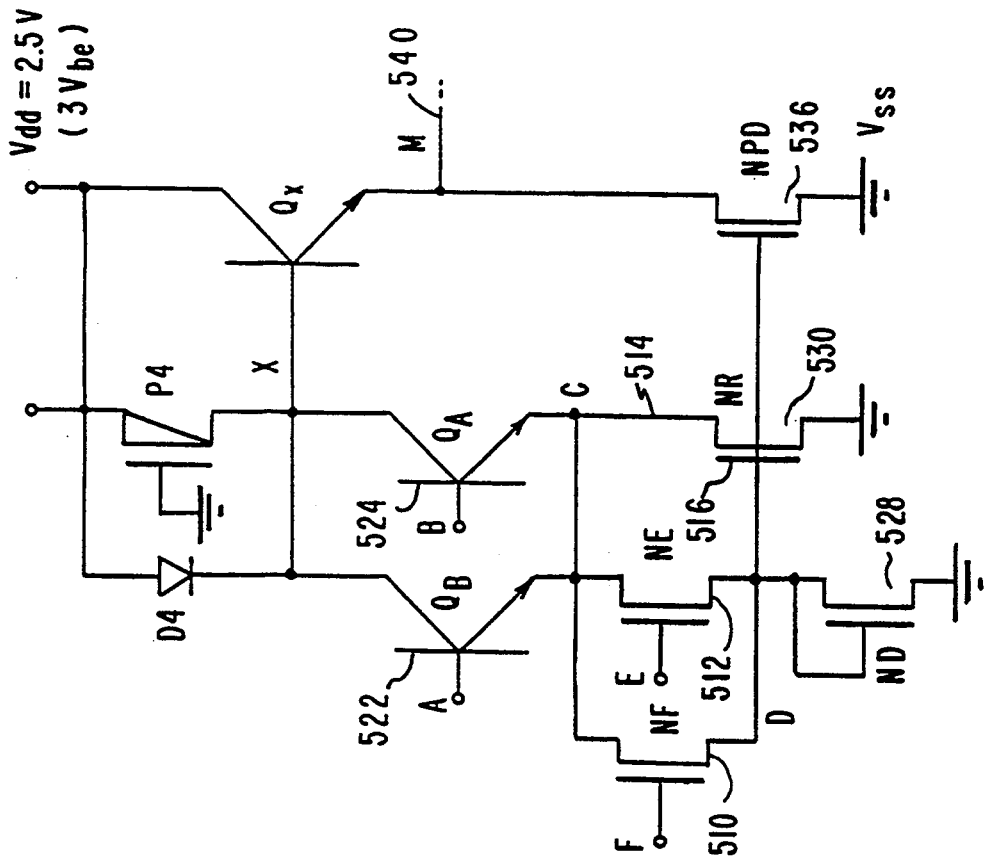
FIG. 4 is a functional diagram of an NTL-based BiCMOS circuit with cascoded bipolar and CMOS logic in accordance with the second embodiment of this invention.
Figure 5:
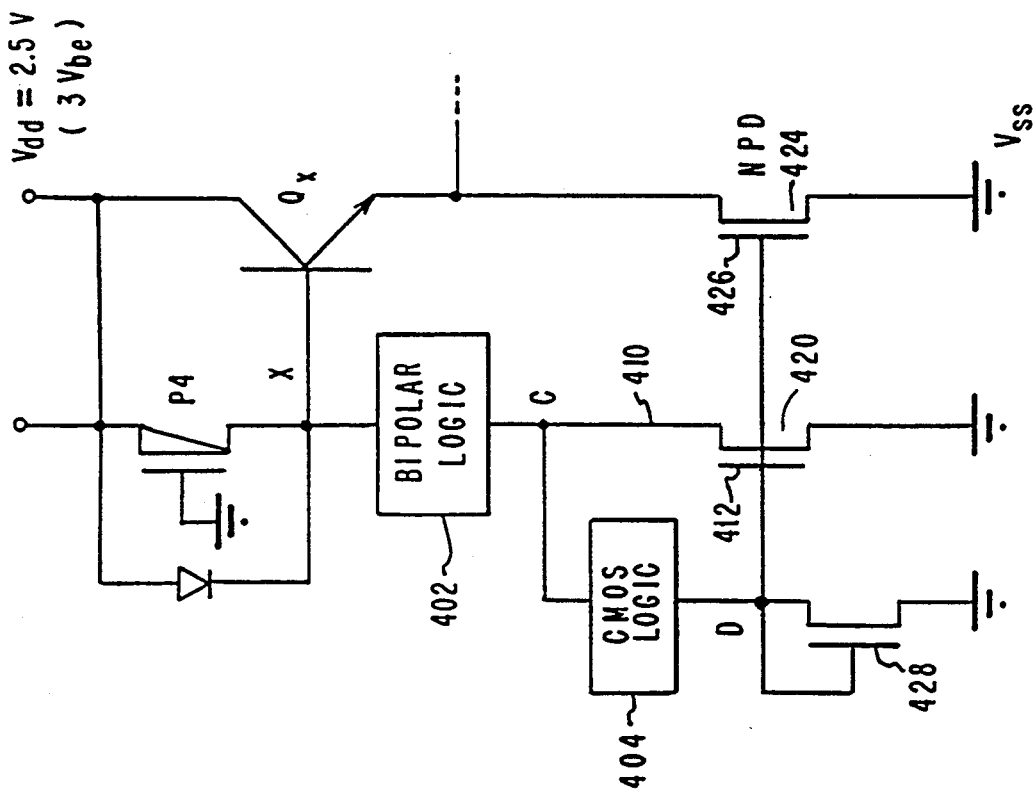
FIG. 5 is a schematic diagram of an NTL-based BiCMOS circuit using cascoded bipolar and CMOS logic and illustrating an AND/OR configuration for the CMOS and bipolar logic.

FIGS. 4 and 5 show a more generalized embodiment of the present invention. This embodiment allows the implementation of a two-level logic function in a single NTL/BiCMOS circuit. This is accomplished by cascoding bipolar logic with CMOS logic. First-level logic is implemented in a bipolar network and the second-level employs a CMOS network.

The concept of adding a second-level logic into an NTL/BiCMOS circuit is shown in FIG. 4. The first level of logic is a bipolar network 402, which connects NPN transistors in parallel to perform an OR function. The second-level logic is a CMOS network 404, which is placed between the drain 410 (at node C) and gate 412 of the NFET diode 420. The passive NFET diode from the circuit of the first embodiment 312 now becomes an active NFET diode 420 gated by a CMOS logic network 404. The CMOS logic network 404 is also used to control the pull-down NFET 424 and is connected at the gate 426 of the pull-down NFET 424. A second NFET diode is placed between the gate of NFET diode 420 and ground $(V_{ss})$.

The input signal level to the CMOS logic network 404 is the same as that to the bipolar network 402 so that the distribution of signals to either bipolar or CMOS devices is simplified. A multilevel logic network is made possible since an NFET diode is used as the current source.

FIG. 5 is a functional diagram implementing a two-level inverted AND-OR function based upon the generalized circuit of FIG. 4. The CMOS logic network 404 of FIG. 4 has been specified in FIG. 5 as two N-channel MOSFETS 510 and 512 connected in parallel and functioning as an OR network. This OR network is ANDed with the OR function of the emitter coupled bipolar input transistors 522 and 524 and then inverted. A second NFET diode 528 is connected between the gate 516 of NFET diode 530 and ground $(V_{ss})$. This additional device allows node D to discharge to $V_{tn}$ when the current path is cut off by the CMOS logic network.

It can be seen by those skilled in the art that when the CMOS logic network is closed (i.e. either of the N-channel MOSFETS are turned on), the drain 514 and gate 516 of the NFET diode 530 are shorted together. As a result, the circuit functions in the same manner as the single-level NTL/BiCMOS circuit shown in FIG. 3(a) and described as the first embodiment.

On the other hand, when the CMOS logic network is opened (i.e. all of the inputs at the N-channel MOS devices are at a low level of 0.8 volts), both the NFET diode 530 and the pull-down NFET 536 are switched off by a bias of $(0.8-V_{tn})$ volts at node D. As a result, the output 540 stays at a high level close to 1.6 volts regardless of the inputs at bipolar input transistors 522 and 524. It can be seen that the NPN logic is thus logically ANDed with the CMOS logic.

It should also be noted that the CMOS logic could instead consist of NFET transistors connected in series and to the gate 516 of the NFET diode 530 in order to provide an AND function which would be ANDed with the bipolar logic using the cascode design.

While the invention has been described in its preferred embodiments, it is to be understood that the words which have been used are words of description rather than limitation and that changes within the purview of the appended claims may be made without departing from the true scope and spirit of the invention in its broader aspects.

Having thus described the invention, what is claimed as new and what is desired to be secured by Letters Patent is:

1. A circuit comprising:

a resistive element connected between a first operating potential and the collector of a first bipolar transistor, said first bipolar transistor having its base connected to first input terminal;

a second bipolar transistor, having its collector connected to said first operating potential, its emitter connected to an output terminal, and its base connected to the collector of said first bipolar transistor;

a clamping diode connected across said resistive element, a first NFET transistor having one of its drain and source electrodes connected to a second operating potential, the other of its drain and source electrodes and its gate electrode connected to the emitter of said first bipolar transistor; and a second NFET transistor having one of its drain and source electrodes connected to said output terminal, the other of its drain and source electrodes connected to said second operating potential and its gate electrode connected to the emitter of said first bipolar transistor.

2. The circuit of claim 1 wherein said first operating potential is a high positive supply potential and said second operating potential is ground.

3. The circuit of claim 2 wherein said bipolar transistors are NPN transistors.

4. The circuit of claim 2 wherein said resistive element is a PFET.

5. The circuit of claim 2 wherein said clamping diode is a junction diode.

6. The circuit of claim 2 wherein said clamping diode is an NPN bipolar transistor connected as a diode.

7. The circuit of claim 2 further comprising at least one additional bipolar transistor arranged in parallel with said first bipolar transistor, having its base connected to a second input terminal, its emitter connected to the gate of said second NFET transistor and its collector connected to the base of said second bipolar transistor.

8. A semiconductor integrated circuit including bipolar transistors and MOS transistors on the same substrate, comprising:

a PFET transistor having one of its drain and source electrodes connected to a voltage source and the other of its drain and source electrodes connected to the collector of a first bipolar transistor, said first bipolar transistor having its base connected to a first input terminal;

a second bipolar transistor, having its collector connected to said voltage source, its emitter connected to an output terminal, and its base connected to the collector of said first bipolar transistor;

a clamping diode connected across said PFET transistor;

a first NFET transistor having one of its drain and source electrodes connected to ground, the other of its drain and source electrodes and its gate electrode connected to the emitter of said first bipolar transistor; and a second NFET transistor having one of its drain and source electrodes connected to said output terminal, the other of its drain and source electrodes connected to ground and its gate electrode connected to the emitter of said first bipolar transistor.

9. The circuit of claim 8 wherein said PFET transistor has its gate connected to ground and said first and second bipolar transistors are NPN transistors.

10. The circuit of claim 9 wherein the clamping diode is a junction diode.

11. The circuit of claim 9 wherein the clamping diode is an NPN bipolar transistor connected as a diode.

12. The circuit of claim 9 further comprising at least one additional bipolar transistor arranged in parallel with said first bipolar transistor, having its base connected to a second input terminal, its emitter connected to the gate of said second NFET transistor and its collector connected to the base of said second bipolar transistor.

13. A BiCMOS logic gate providing a NOR function comprising:

a PFET transistor, functioning as a linear resistor, having one of its drain and source electrodes connected to a voltage source and the other of its drain and source electrodes connected to the collector of a first NPN bipolar transistor, said first NPN bipolar transistor having its base connected to an input terminal;

a second NPN bipolar transistor, having its collector connected to said voltage source, its emitter connected to an output terminal, and its base connected to the collector of said first NPN bipolar transistor;

a first NFET transistor having one of its drain and source electrodes connected to ground, the other of its drain and source electrodes and its gate electrode connected to the emitter of said first NPN bipolar transistor;

a second NFET transistor having one of its drain and source electrodes connected to said output terminal, the other of its drain and source electrodes connected to ground and its gate electrode connected to the emitter of said first NPN bipolar transistor; and a third NPN bipolar transistor connected as a diode across said PFET transistor to provide a clamping function on the output node.

14. A circuit comprising:

a resistive element connected between a first operating potential and the collector of a first bipolar transistor, said first bipolar transistor having its base connected to a first input terminal;

a second bipolar transistor, having its collector connected to said first operating potential, its emitter connected to an output terminal, and its base connected to the collector of said first bipolar transistor;

a clamping diode connected across said resistive element,

CMOS logic means operatively connected to the emitter of said first bipolar transistor and the gate of a first NFET transistor;

said first NFET transistor having one of its drain and source electrodes connected to a second operating potential, the other of its drain and source electrodes connected to the emitter of said first bipolar transistor and its gate electrode connected to said CMOS logic means;

a second NFET transistor having one of its drain and source electrodes connected to said output terminal, the other of its drain and source electrodes connected to said second operating potential and its gate electrode connected to the gate of said first NFET transistor.

15. The circuit of claim 14 wherein said first operating potential is a high positive supply potential and said second operating potential is ground.

16. The circuit of claim 15 further comprising at least one additional input bipolar transistor arranged in parallel with said first bipolar transistor, having its base connected to a second input terminal, its emitter connected to said CMOS logic means and its collector connected to the base of said second bipolar transistor.

17. The circuit of claim 16 wherein said CMOS logic means consists of a third NFET input transistor having one of its drain and source electrodes connected to the emitter of one of said bipolar input transistors, the other of its drain and source electrodes connected to the gate of said first NFET transistor and its gate connected to a third input terminal.

18. The circuit of claim 17 wherein said CMOS logic means further comprises at least one additional input NFET transistor arranged in parallel with said third NFET input transistor, having one of its drain and source electrodes connected to the emitter of one of said bipolar input transistors, the other of its drain and source electrodes connected to the gate of said first NFET transistor and its gate connected to a fourth input terminal.

19. The circuit of claim 17 wherein said CMOS logic means further comprises at least one additional input NFET transistor arranged in series with said third NFET input transistor.

20. The circuit of claim 15 further including a third NFET transistor having one of its drain and source electrodes connected to ground and the other of its drain and source electrodes and its gate electrode connected to the gate of said first NFET transistor.

* * * * *